United States Patent [19]

Sellers

[11] 4,395,688

[45] Jul. 26, 1983

[54] LINEAR PHASE FILTER WITH SELF-EQUALIZED GROUP DELAY

[75] Inventor: Robert W. Sellers, Palm Bay, Fla.

[73] Assignee: Harris Corporation, Melbourne, Fla.

[21] Appl. No.: 291,937

[22] Filed: Aug. 11, 1981

[51] Int. Cl.³ .................. H03H 7/075; H03H 7/09
[52] U.S. Cl. .................................. 333/169; 333/168; 333/176; 333/178
[58] Field of Search .................... 333/167–171, 333/175–179, 138–140, 23

[56] References Cited

U.S. PATENT DOCUMENTS

| | | | |
|---|---|---|---|
| 3,119,067 | 1/1964 | Wohlenberg et al. | 333/175 X |
| 3,222,970 | 5/1967 | Batteau. | |
| 3,252,093 | 5/1966 | Lerner | 333/166 X |
| 3,316,483 | 4/1967 | Hall | 333/169 X |
| 3,365,679 | 1/1968 | Matsumoto et al. | 333/169 |

FOREIGN PATENT DOCUMENTS 530038 9/1956 Canada.
797397 7/1955 United Kingdom.

OTHER PUBLICATIONS

Lerner—"Band-Pass Filters with Linear Phase", Proceedings of the IEEE, Mar. 1964, pp. 249–268.

Primary Examiner—Marvin L. Nussbaum
Attorney, Agent, or Firm—Antonelli, Terry & Wands

[57] ABSTRACT

In modern communication systems, it has become important to provide filters, and in particular bandpass filters, which can provide substantially uniform group delay across the bandwidth of the filter while still achieving good amplitude response. In this regard, it is particularly desirable to substantially reduce the large variations in the phase characteristics found in conventional bandpass filters at the nominal band edge of the filter. To accomplish this, a filter is provided having at least one pair of lattice arms coupled in parallel to one another between the input and output of the filter. Each of the lattice arms includes a plurality of resonant LC resonators, each of the resonators having a different resonant frequency than the center frequency of the filter. In particular, within the bandwidth of the filter, the exponential damping coefficients for the resonators in each arm are set to decay at the same rate. This desired decay can be accomplished by exponential sizing of the components.

32 Claims, 7 Drawing Figures

LINEAR PHASE FILTER WITH SELF-EQUALIZED GROUP DELAY

FIELD OF THE INVENTION

This invention relates generally to methods of and apparatus for filtering an electrical signal. More particularly, it relates to an improved filter and method of filtering having substantially linear phase even in the region of the nominal band edges (hereinafter referred to as NBE) of the filter while still providing good amplitude characteristics.

BACKGROUND OF THE INVENTION

Electrical filters are used for a wide variety of purposes in virtually every type of electronic communication and control systems. In particular, bandpass filters are of great value in communication equipment in permitting passage of desired received signals in certain frequency ranges while attenuating noise and undesired signals in surrounding frequency ranges.

An ideal bandpass filter would be one which has uniform transmission (i.e. the amplitude characteristic) and uniform delay (i.e. linear phase) for all frequency components within the passband of the filter, while simultaneously exhibiting zero transmission outside of the passband. It has been theoretically shown to be impossible to achieve this in classical articles such as "Fourier Transforms in the Complex Domain" by Paley and Wiener in the Am. Math. Society Colloquia, Vol. XIX, Therorem 12, pages 16–18, 1934 and "The Physical Realizability and Realization of Linear Phase Networks" by P. M. Chirlian, Quart. Appl. Math., Vol. 18, pages 31–35, April 1960.

Although this ideal filter cannot be achieved, reasonably good approximations exist for obtaining bandpass characteristics (as well as low pass characteristics), and a great deal of research has been done to develop filters providing such approximations. This research has led to the development of such classic models as the Butterworth model (which seeks a maximally flat characteristic for either the phase or attenuation) and the Chebyshev model (which provides for an equal ripple of the characteristic under control between the limits of the passband).

During the early development of such approximations for bandpass filters, the primary concern was for the amplitude characteristic. This resulted from the fact that most of the applications for such bandpass filters involved speech transmission, and, in such speech transmission, phase distortion was not nearly as significant as amplitude distortion. In the approximations developed, the better the approximation of the amplitude characteristic, the greater the phase distortion turned out to be near the band edge. Similarly, improvements in the phase characteristic led to a deterioration of the amplitude characteristic until it resembled a Bell-shaped curve.

Accordingly, when it was necessary to have a reasonably good phase characteristic in addition to a good amplitude characteristic, it became typical design procedure to utilize a filter network providing the desired amplitude characteristics and known but unacceptable phase characteristics. This network is then followed by an all-pass equalizer to improve the overall phase characteristics. In this method, an equalization pole is typically required for each pole in the filter network. This conventional approach is generally considered a straightforward and acceptable method for implementation of high quality linear phase filters. The main objection to this method however is the large number of components required. This increases the time needed to adjust the filters, and the quality and training of the personnel needed to perform the alignment. However, since the original need for such techniques was not great, these difficulties were readily tolerated.

Eventually, with the development of high capacity communication systems, the phase characteristic became more important since vast amounts of data other than simple speech had to be handled by such systems. Under these conditions, phase distortion often became a serious problem. Correspondingly, interest heightened in providing a filter, and in particular a bandpass filter, which would have both good amplitude and good phase characteristics without the difficulties encountered in prior equalization techniques.

SAW type filters represent one recently developed type of filter which shows that it is possible to make close approximations to the ideal bandpass filter characteristics both for amplitude and phase. SAW filters, however, have certain features which make them very undesirable for use in wideband analog systems such as FM-FDM. The first is the large insertion loss. This necessitates high intercept point amplifiers to replace the system gain which is lost. Secondly, SAWs exhibit triple transient reflections, or echo, which limit the system's NPR. A third shortcoming of SAW filters is the temperature dependency of the narrow bandwidth units when fabricated in a lowcost material such as Lithium Niobate.

Another technique developed for achieving both a good amplitude characteristic and a relatively linear phase response is described in an article by Robert M. Lerner entitled "Bandpass Filters with Linear Phase", Proceedings of the IEEE, March 1964, pages 249–268. Essentially, this article describes full- and half-lattice filter systems with the delay self-equalized over a large portion of the filter 3-dB bandwidth. FIG. 2 illustrates the basic half-lattice filter envisioned by Lerner with a pair of lattice arms 10 and 12 coupled across a 1:1:1 transformer 14. The individual arms 10 and 12 are shown for an admittance configuration Y in FIG. 2. As taught by Lerner, in both cases, $Y_A$ and $Y_B$ consist of a number of (lossless) series resonant circuits connected in parallel to one another. The resonators are of two types; all but two are in-band resonators in which the inductances all have the same magnitude L; the other two are corrector resonators whose inductors are nominally 2L. The resonators are tuned to frequencies $f_1$, $f_2$ . . . at equal intervals 2 $\Delta f$ across the desired passband, alternate frequencies $f_1$, $f_3$, $f_5$ . . . being assigned to $Y_A$ and $f_2$, $f_4$ . . . being assigned to $Y_B$. A frequency $\Delta f$ below $f_1$ is the nominal 6-dB band edge of the filter. One of the corrector resonators is tuned to this frequency and assigned to the network branch opposite to that of the $f_1$ resonator ($Y_B$ in FIG. 2). Similarly, the other corrector resonator is tuned to a frequency $\Delta f$ above that of the uppermost in-band resonator $f_n$ and assigned to the opposite network branch. The resistance R is taken equal to $4/\pi$ times the (calculated) impedance of L at a frequency of 2 $\Delta f$ Hz. In addition, Lerner taught that parallel-tuned LC (resonant in-band) and, in some cases, series-tuned LC circuits (resonant out-of-band) may be placed across the loads for compensation purposes.

FIG. 3 illustrates the output of Lerner's filter using nine poles. Although it is apparent that a reasonably linear phase is achieved across the majority of the passband, it is also clear that substantial deterioration, or so-called "ears" exist at the edges of the passband. Some improvement can be achieved by increasing the number of poles. But this is undesirable both from a cost and size viewpoint, as well as from the fact that substantial adjustment is necessary for a large number of poles.

SUMMARY OF THE INVENTION

It is, therefore, an object of the present invention to provide an improved electric filter.

Another object of the present invention is to provide an improved linear phase filter having substantially uniform group delay across the bandwidth of the filter and a good amplitude response.

It is a further object of the present invention to provide an improved linear phase filter having improved linearity near the band edges.

Yet another object of the present invention is to provide an improved linear phase filter having an improved linearity near the band edges without the requirement of a large number of resonators.

With these and other objects in mind, the present invention provides an improved filter having at least one pair of lattice arms coupled in parallel to one another between the input and output of the filter. Each of the lattice arms includes a plurality of resonant LC resonators, each of the resonators having a different resonant frequency within the bandwidth of the filter. In particular, within the bandwidth of the filter, the exponential damping coefficients for the resonators in each arm set to decay at the same rate. This can be accomplished by exponential sizing of the elements.

BRIEF DESCRIPTION OF THE DRAWINGS

Other objects and advantages of the present invention may be more clearly understood by reference to the following detailed description and drawings wherein.

DETAILED DESCRIPTION OF THE INVENTION

Figure 4:
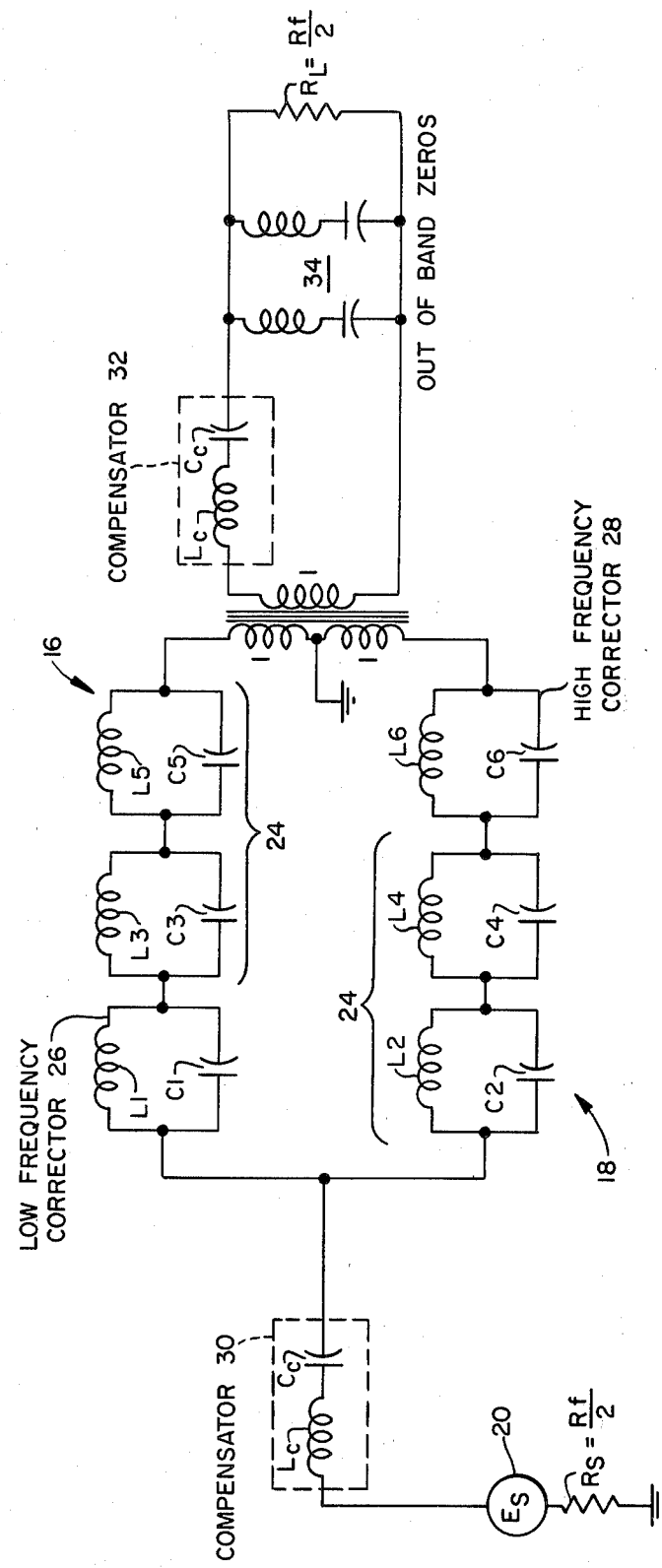
FIG. 4 is a circuit diagram illustrating one embodiment of the present invention.

Referring now to the drawings, FIG. 4 provides an illustration of a preferred embodiment of the present invention in a half-lattice arrangement. As such, a pair of lattice arms 16 and 18 are coupled between an input source 20 and a 1:1:1 transformer 22. Each arm comprises a plurality of in-band parallel resonators 24 tuned to have parallel resonant frequencies falling within the passband of the filter. Each resonator 24 has values of $L_n$ and $C_n$ chosen to establish resonance at different frequencies. By way of example, FIG. 4 shows four in-band resonators which will have frequencies of resonance of $f_2$, $f_3$, $f_4$, and $f_5$. These frequencies of resonance are alternated across the arms so that parallel resonance at $f_2$ and $f_4$ is provided in arm 18 while parallel resonance at $f_3$ and $f_5$ is provided in arm 16.

In addition to in-band resonators, arm 16 includes a low frequency corrector resonator 26 and arm 18 includes a high frequency corrector resonator 28. These corrector resonators are both tuned for parallel resonance at frequencies out of the band for reasons discussed hereinafter.

To assist in observing reactive components of both the filter source and load, a compensator 30 is provided between the source 20 and the lattice arms 16 and 18, and a compensator 32 is provided between the output of the transformer 22 and the load resistor $R_L$. These compensators are made up of series LC circuits. Also, out-of-band zeros can be provided by shunting the resistor $R_L$ with series LC resonators 34 to provide improved rejection outside of the passband.

Insofar as the general circuit construction is concerned, FIG. 4 is a Z domain (impedance) version of the Lerner admittance filter described earlier. In other words, in FIG. 4, parallel LC resonators are provided in series with one another in each arm rather than series resonators being provided in parallel to one another in each arm as described by Lerner. Thus, if one were to use impedance terminology to design the admittance style filter discussed by Lerner, one would arrive at a filter which would appear similar to that shown in FIG. 4 as far as the general circuit configuration is concerned. However, following the teachings of Lerner, one would have a filter wherein the frequencies of the parallel resonators of all the in-band resonators at $f_2$–$f_5$ would be evenly spaced across the bandwidth at 2 $\Delta f$ from each other with all of the filter capacitances being the same. The corrector resonators would have values of 2C, and would have resonances at $\Delta f$ away from frequencies $f_2$ and $f_5$ at the frequencies $f_1$ and $f_6$ right at the edge of the bandwidth. As will be discussed hereinafter, such settings of element values and frequencies of resonance do not provide the best results since they lead to the production of "ears" in the phase characteristics at the nominal band edges (NBE). Accordingly, the present invention provides for significantly different values for the element values and/or frequency spacing to overcome these problems.

Figure 1:
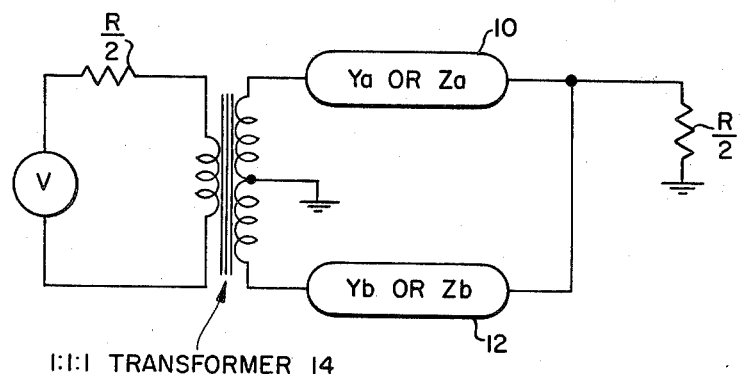
FIGS. 1 and 2 are circuit diagrams showing the general configuration of the prior art Lerner filter.
Figure 7:
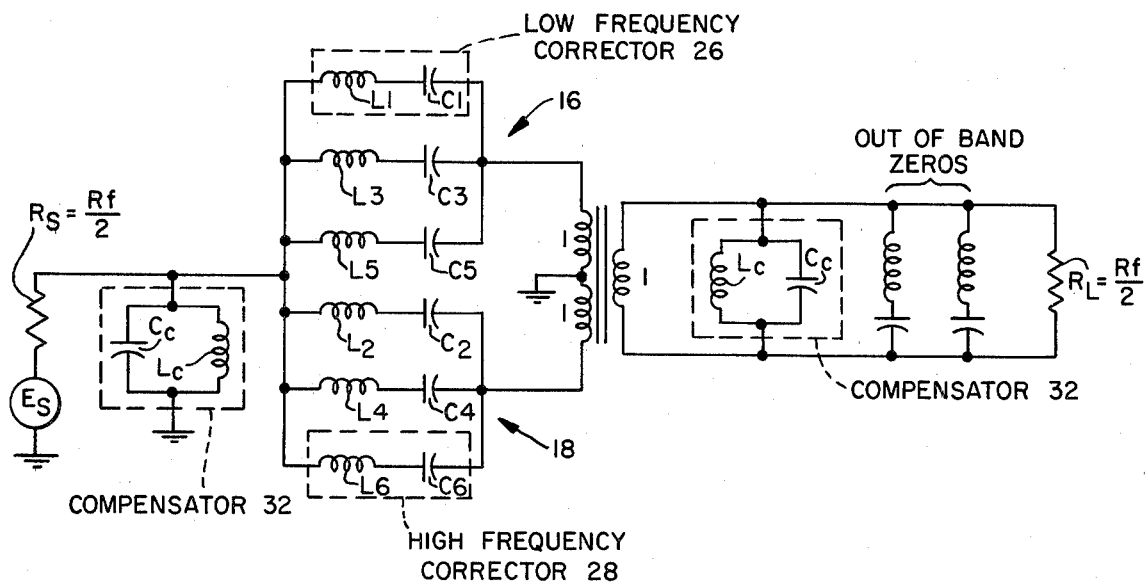
FIG. 7 is a circuit diagram of an alternative embodiment which would be used in a Y configuration in accordance with the present invention.

Before proceeding, it should be noted that an important design consideration exists for utilizing Z-style circuits such as shown in FIG. 4 rather than the Y circuit arrangement of FIG. 1 if high center frequencies and narrow bandwidths are involved. In this Y circuit, Lerner teaches (page 4, line 16 of this application) that for fixed bandwidth and number of resonators, the filter resistance is proportional to inductance. At high center frequencies, therefore, large inductors are required. This can lead to self-resonance within the inductors themselves at high center frequencies. Thus, for high frequencies, a Z-style circuit such as FIG. 4 is generally preferred, since the inductance values required are electrically much smaller. However, the present invention is also applicable at lower frequencies to using a Y configuration with values set in accordance with the teachings of the present invention to be set forth hereafter. In this regard, FIG. 7 illustrates a Y configuration in accordance with the present invention.

Turning now to the operation of FIG. 4, it is important to realize that the "bandpass" characteristic is brought about by 180° summation in the transformer. For example, at frequencies far from the resonances of the lattice arms, the input signal is split into equal amplitude and opposite sign (due to the transformer) portions which cancel each other in the load. On the other hand, when an input signal has a frequency equal to the parallel resonance of one of the resonators, the arm which that resonator is in transmits relatively less of the signal than does the other, producing an imbalance in the relative amplitudes, and hence an output to the load. Here it is important to note that values for inductance and capacitance for the resonators are chosen so that the arm without parallel resonance has a series resonance at the signal frequency. For example, when arms 16 and 18 are presented a signal frequency of say $f_3$, then $L_3$ and $C_3$ produce maximum impedance between the ends of arm 16, while arm 18 has an attenuation zero at $f_3$. This is because the frequency spacing and component values are chosen so that the residual capacitance $C_2$ from $f_2$ and the inductance $L_4$ from $f_4$ will make arm 18 series resonant at $f_3$. This is done for each of the resonators so that the poles and zeros alternate between the lattice arms, with one neatly cancelling the residual of the other, across the passband. If the circuit components are thus selected correctly, the filter is self-equalized over the in-band portion of the passband.

This filter network is thus designed to have a relative phase difference between the lattice arms of 90° across the passband, at frequencies between individual resonances. This is purposely achieved by the selection of the resonances to interlace with a "periodicity" of $\Delta f$, equivalent to using a very long transmission line in each lattice, with one 90° longer than the other at a frequency of 2 $\Delta f$. It is this phase difference that allows the ratio of the transfer functions to have both poles and zeros in the right-half plane. Here the right-half plane poles imply that one of the networks has less phase than the other and not that the output of either network anticipates the input signal, an obvious impossibility. With a sufficient number of poles, it is theoretically (see "Computation Methods for Broad-Band 90° Phase-Difference Networks", by W. J. Albersheim et al, Proc. IEEE Trans. CT., May 1969) possible to approximate this 90° phase difference over a given range of frequencies to within any desired phase tolerance.

The general concept of using the relative phase between two networks to achieve flat time delay is well known. Both the Albersheim article and an article entitled "Linear Phase Filters and the Demise of External Equalization" recognized the need for more than one signal path between the input and output in order to allow time-invariant (linear phase) transmission through a two-port device. However, up to this time, attempts such as the Lerner filter to implement good linear phase operation using the relative phase between two paths have not sufficiently reduced the variation at the nominal band edges (NBE) of the filter.

Accordingly, in the present invention, it is sought to "turn the corner" with the group delay characteristic with the same sort of authority as the amplitude response. Since group delay is the derivative of phase shift versus frequency, a function should be selected for phase shift change at the NBE which has the same shape as its derivative. We are then limited to selecting one of the transcendental functions. Lerner had selected the cosine shape. However, based on the inventor's experiments, it has been determined that an exponential relationship provides superior results in that a substantial reduction of the variation at the NBE can be achieved.

A purely resistive network is truly time invariant. However, without the inclusion of frequency selective components, no filter results. It is here that it must be realized that it is not necessary for the (composite) network to be time invariant at all frequencies, but it should have different but controlled values of transmission (resistance) at particular frequencies in each lattice arm. And, in particular, it has been determined in accordance with the present invention that within the desired passband each resonator be memoryless, or critically damped with respect to the other resonators. In other words, in accordance with the present invention the exponential damping coefficient of each of the resonators is set so that it decays at the same rate as the other resonators in the arm. This infers for the complete (half) lattice that either:

(1) the tuned frequency of each resonator be offset from the linear spacing taught by Lerner, or (2) the magnitude of the individual inductances in a Y lattice or capacitances in a Z lattice be modified accordingly, i.e., they will not all be the same value, as dictated by the Lerner method.

In particular, through experiments it has been determined in accordance with the present invention that the desired exponential damping coefficients can be achieved by exponential sizing of the elements. For example, in a Z lattice such as FIG. 4, the size of the capacitors in the resonators in each arm will be set to be substantially exponentially related to the capacitance which is predetermined for resonance at the center frequency of the filter.

Figure 5:
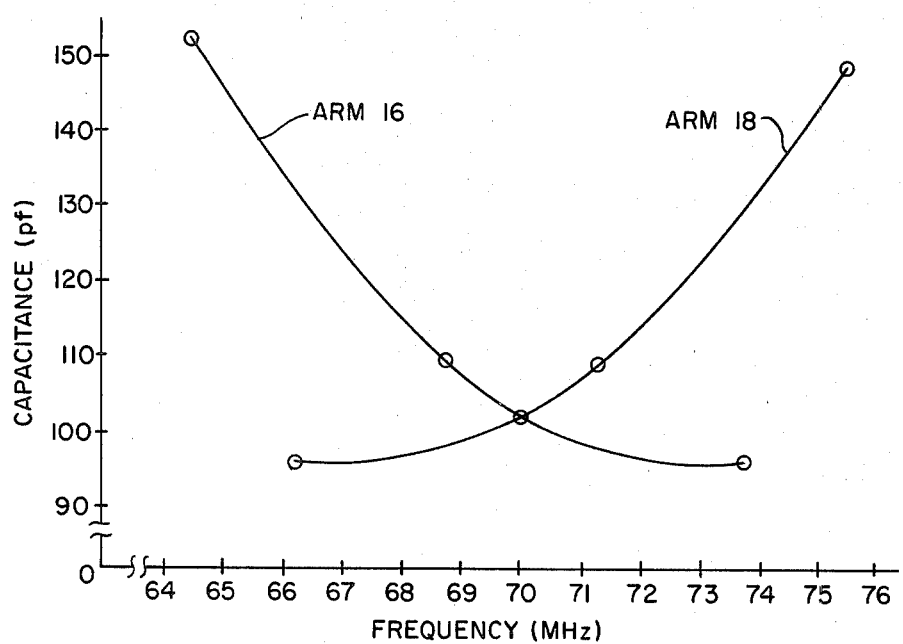
FIG. 5 is a graph showing the exponential relationship of values for the capacitors in the embodiment of FIG. 4.

FIG. 5 provides an illustration of this substantially exponential relationship in a situation where in-band frequencies $f_2$–$f_5$ are linearly spaced within the passband of the filter. Basically, FIG. 5 shows how the value of capacitance changes in accordance with the frequencies of resonance at which each resonator resonates. Thus, in the arm 16, the highest value of capacitance is found in the lowest frequency of resonance $f_1$ and the capacitance decreases exponentially from this point to its lowest value at the resonator for $f_5$. On the other hand, arm 18 has its lowest value of capacitance at its lowest frequency $f_2$ and increases exponentially to its highest value at $f_6$. And, as seen in FIG. 5, the respective exponential increase and decrease in the arms are both centered around the predetermined capacitance at the center frequency $f_0$ located between $f_3$ and $f_4$. Thus, it can be seen that this setting of exponential values for the capacitance represents a completely different approach than that followed by Lerner (which would utilize identical values of capacitance for all in-band resonators).

This same exponential setting of values would be found in a Y lattice such as FIG. 1 when the present invention is applied to such a Y lattice. Specifically, rather than utilize an identical inductance throughout, as suggested by Lerner, the inductance would again be varied exponentially along each arm relative to the predetermined inductance for the center frequency.

Some discussion of the theoretical background for the invention will now be given followed by specific examples of setting values and frequencies in accordance with the present invention.

The above considerations are not possible with a minimum phase design since a circuit "Q" greater than unity is required to achieve selectivity. With the half-lattice design, the cancellation provided by the transformer phase inversion can be used to provide the selectivity, and if LC circuits having exponential damping coefficients which decay at the same rate are employed in accordance with the present invention, the resultant network (loaded) Q for the individual arms is 0.5, or, effectively, that of a single critically damped LC circuit.

It is well known that the general form of the natural response of a parallel resonant RLC circuit is:

$$V_{(t)} = A_1 e^{S_1 t} + A_2 e^{S_2 t} \tag{1}$$

where $$S_{1,2} = -\alpha \pm \sqrt{\alpha^2 - \omega_0^2}, \tag{1A}$$

$A_1$ and $A_2$ represent the arbitrary constants used to satisfy some specified initial conditions of i and V, $1/2RC = \alpha$ is the exponential damping coefficient, or Neper frequency, and $$\omega_0 = \frac{1}{\sqrt{LC}}$$

is the resonant radian frequency of the circuit. The RLC circuit is over-damped when $LC > 4R^2C^2$, and under-damped when $LC < 4R^2C^2$. Critical damping occurs when $LC \equiv 4R^2C^2$. The single special case of critical damping produces a unique circuit. This can be seen by allowing $\omega_0$ to be equal to $\alpha$ in equation 1A. At this point, equation (1) apparently loses its meaning because $S_1 = S_2 = S$, and it can be rewritten as $$V_{(t)} = A_1 e^{ST} + A_2 e^{ST} = A_3 e^{ST}. \tag{2}$$

Equation (2) contains only one arbitrary constant, but there are two initial conditions which must be satisfied. The solution to this apparent problem is given in several elementary circuit texts and can be found by regression to the defining differential equation for a parallel resonant RLC circuit which reduces to:

$$V_{(t)} = e^{-\alpha t}(A_1 t + A_2) \tag{3}$$

or $$V_{(t)} = A_1 t e^{-\alpha t} + A_2 e^{-\alpha t}. \tag{4}$$

It should be noted that:

(1) this is not an overall exponential solution as is equation (1), (2) the solution is expressed as the sum of two terms, one being the negative exponential, but the second being t times the negative exponential, and (3) $e^{-\alpha t}$ is a simple delay operator, exponential in time.

The real and the imaginary parts of the complex frequency describe, respectively, the exponential and the sinusoidal variation of an exponentially varying sinusoid. Our ordinary concept of "frequency" actually carries with it another connotation in addition to "repetitions per second". It also tells us something about the rate of change of the function being considered. For example, if we take $$f(t) = K e^{St} \tag{5}$$

and differentiate to obtain the time rate of change of f(t)

$$df/dt = SKe^{St},$$

and normalize by dividing by f(t) we have:

$$(df/dt)/f_{(t)} = S.$$

This normalized rate of change is a constant, independent of time. It is moreover identically equal to the complex frequency S. We may, therefore, interpret complex frequency as the "normalized time rate of change" of the complex exponential function (5). This alternate definition may lead to some curious results. For example, although the complex frequency associated with the function $e^{j\omega t}$ is $s = j\omega$, the normalized rate of change associated with $\cos \omega t$ must be $(-\omega)\tan \omega t$. If we try to treat the result, which is a function of time, as a complex frequency, then we are led to a complex frequency which is a function of time. The correct answer is obtained only when it is recognized that a conjugate pair of complex frequencies is required to characterize $\cos \omega t$. This pair, however, may be uniquely (as in the case of critical damping), equal to each other. This "curious results" could represent the monotonic (resistive) nature of a properly terminated coaxial cable. Such a cable can be modeled as a series of L-C networks, and they will be found to be critically damped when no reflections are present such as when the cable has proper resistive terminations.

Returning to the filter network, it is worthwhile to describe the means by which it achieves its performance. This can be more easily explained by first digressing and using an example of a network which cannot be realizable. In general, a filter network with the idealized amplitude response (rectangular) is not realizable. This is not due to the steepness with which the amplitude cuts off, but rather because it cuts off to zero.

Even the Gaussian amplitude response filter attenuates too much to satisfy the realizability criterion. For example, consider that a series of n R-C networks are cascaded (with isolation) to approximate a Gaussian error curve. This filter would have an amplitude response of:

$$A_n(\omega) = \left(1 + \frac{\omega^2 \ln 2}{n}\right)^{-n/2} \tag{6}$$

with an associated phase function of $$\phi n(\omega) = n \tan^{-1}\left(\frac{\omega \sqrt{\ln 2}}{\sqrt{n}}\right). \tag{7}$$

Comparing equation (6) with a Gaussian error curve having $\omega = 1$ as its 3-dB point (0.707), e.g.:

$$A = e^{-\omega^2(\ln 2/2)}, \tag{8}$$

it is clear that equations (6 and (8) converge as $n \to \infty$. However, $\phi(n)$ in equation 7) diverges, becoming infinitely large for all $\omega$.

Consider now two cases of amplitude characteristics whose phase functions tend to converge with the amplitude response, e.g.:

$$A(\omega) = (\sin \omega/\omega)e^{-j\omega} \tag{9}$$

and $$A(\omega) = (\sin^2 \omega/\omega^2)e^{-2j\omega}. \quad (10)$$

Filters with these amplitude arguments will be recognized to have the familiar sinc and (sinc)² impulse responses, which certainly insinuates flat time delay and amplitude response in the frequency domain. It is easily seen that the associated phase functions converge (as a matter of fact converge to linear phase lags of $\omega$ and $2\omega$ radians respectively).

The practical significance to these two cases is that although networks of the form of equation (9) have amplitude characteristics which satisfy the Paley-Wiener criterion, they are only exactly realizable by an infinite number of RLC elements (or by a finite number of lines with distributed constants).

A network defined by equation (10) is not exactly realizable at all over an infinite frequency range, but at the expense of increased time delay, the ideal amplitude and phase characteristics can be approximated arbitrarily closely over a finite frequency range, and as it turns out, with a very finite number of networks. The absolute value function for the filters of the present invention is of the form of equation (10) as evidenced by their characteristics. In particular, the phase slope for filters in accordance with the present invention is $2\omega$ radians. The filter time delay absolute value yields a time-bandwidth product of mean 2, as expected. And finally, the extremely close convergence of amplitude response and time delay is conspicuously evident in the graph shown in FIG. 6 for the characteristics of the filter made in accordance with the present invention.

EXAMPLE

The procedure to be described is based on a design with four in-band resonators and two correction poles such as shown in FIG. 4. For bandwidths less than about 25%, a pair of series tuned compensator circuits such as 30 and 32 are used to improve the group delay even further in the transition regions. These compensator circuits are discussed in Lerner and comprise the means by which the reactive residual components of the network are effectively included as a part of the filter loads. For the wider bandwidth (36 MHz) filters, the low Q necessary in these compensators produce excessive non-symmetry in the amplitude response.

As noted above, the filter may be designed using linear frequency spacing across the passband, and, in this case, exponential component sizing is necessary for the networks. In particular, the present example relates to exponential sizing of the capacitors in a Z lattice. The design is equally valid for the case where sizing of the inductors is made in a Y lattice such as shown in FIG. 7.

Figure 6:
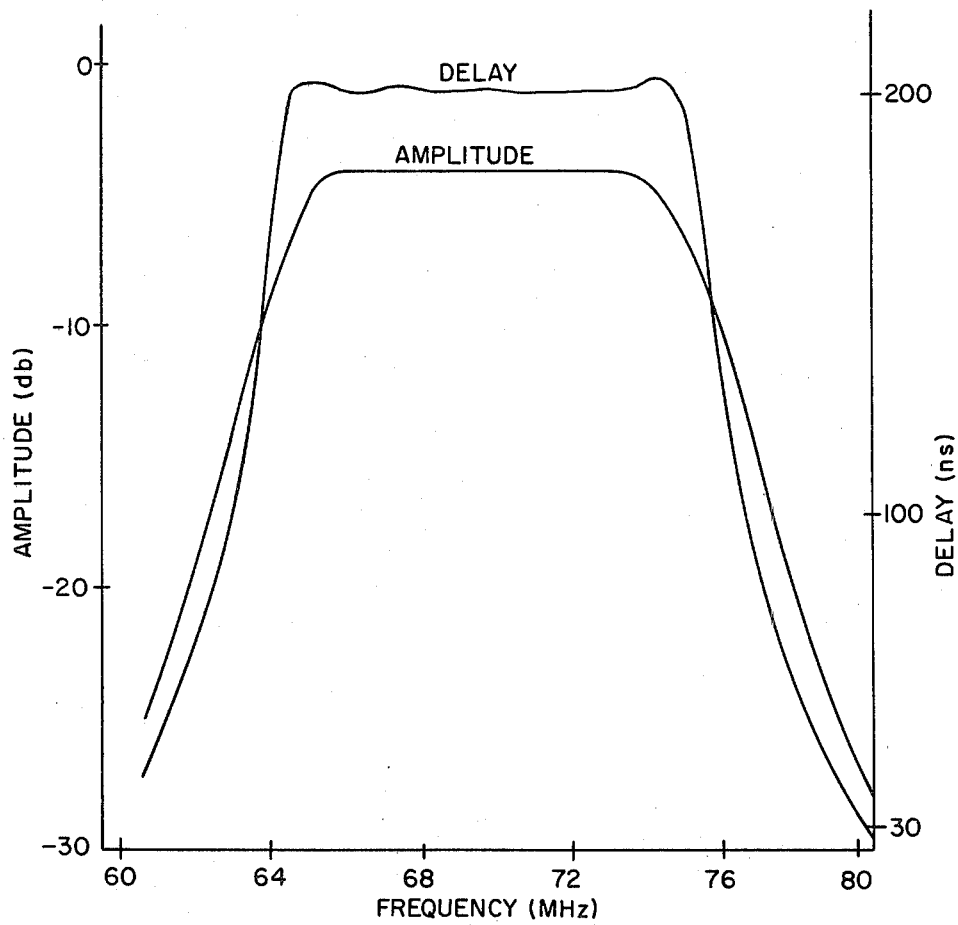
FIG. 6 is a graph showing the amplitude and group delay characteristics of the present invention for a filter described in the example of the present application.

The example will be presented for a filter with the following characteristics, schematically represented by FIG. 6.

Center frequency, $f_0 = 70$ MHz
Bandwidth (3 dB) = 10 MHz
In-band resonators = 4

(1) Determine the frequency spacing necessary between parallel resonances:

$$\frac{10 \text{ MHz } BW}{4 \text{ resonances}} = 2.5 \text{ MHz} = 2 \Delta f.$$

(2) Calculate the actual center frequency of the resonances:

Since there is an even number of networks in the total filter shown in FIG. 4 (both arms), there is no single network resonance at exactly 70 MHz. The two closest ($f_3$ and $f_4$) will therefore be located at $\pm 2\Delta f/2 = \Delta f \pm 1.25$ MHz away from 70 MHz. As in the Lerner filter, linear frequency spacing is used. However, in accordance with the present invention, the same capacitor value is not used for each of the resonators. The linearly spaced frequencies of the resonances are as follows:

$f_2 (L_2 - C_2) = 66.25$ MHz $f_3 (L_3 - C_3) = 68.75$ MHz $f_4 (L_4 - C_4) = 71.25$ MHz $f_5 (L_5 - C_5) = 73.75$ MHz.

$f_1$ and $f_6$ are the corrector poles and will be nominally adjusted to be at the upper and lower band edges of the filter. The calculated frequency for these resonances would be 65 and 75 MHz respectively in the Lerner design. The Lerner method requires that the in-band capacitors each be the same magnitude and the corrector capacitances twice that value. It will be explained hereinafter that a nominal value for these corrector capacitances is set in accordance with the present invention at $\simeq \pi/2$ rather than 2 times the in-band capacitor values. This in turn requires that the frequencies for the corrector resonances be placed $\simeq 20\%$ (of $2\Delta f$) out of band. The correctors will be determined in the final steps of this procedure.

(3) Place the resonances from the lowest in-band frequency ($f_2$) to the highest in-band frequency ($f_5$) in alternate arms of the lattice. At this point, $f_2$ and $f_4$ are in say, arm 18, while $f_3$ and $f_5$ reside in arm 16. A space, $f_1$, is reserved for the low frequency corrector pole in arm 16, and likewise, a space for corrector $f_6$ is reserved in arm 18.

(4) Determine the desired impedance level for the filter. The filter sees a total external resistance of R, which is the sum of the source and load resistance. This step allows the freedom to choose the approximate magnitude of the capacitors to be used in the filter implementation since:

$$R \text{ Filter} = (4/\pi)(X_c)|_{f=2\Delta f}.$$

where $X_c$ is the reactance of the selected capacitor evaluated at a frequency of $2 \Delta f$ (2.5 MHz in this example). In this example, the desired total loop resistance is 500 ohms, and $C = 100$ pF. This capacitor value thus calculated is the "nominal" value to be used in the implementation.

The significance of the 100 pF value which was calculated may be explained by realizing that with an even number of resonators, no network is required at the filter center frequency. If an odd number was selected for the in-band resonators, it would use such a capacitor value. Further, it is customary to assume that any practical filter will only exhibit the calculated resistive component at precisely $f_0$. Small mismatches at in-band frequencies other than $f_0$ are tolerated in this design as well.

(5) Select an unloaded Q for the resonators. This is an important step as all the Q's should be the same. The choice of inductor style as well as capacitor type and frequency range to be covered (B.W. of filter) will all have an impact on this selection. As with any filter, it should have the greatest unloaded Q possible to minimize the filter insertion loss.

For the example filter, inductors are needed in the 50 nh range to resonate the 100 pf capacitors near 70 MHz.

The Q of the inductors should be measured and a good average (practical value) employed for the calculations which follow. Say the average of this unloaded Q is Qu=100, evaluated at 70 MHz.

$X_c$ (nom) at 70 MHz = 22.7$\Omega$ $\therefore R_p = 2.27K = (Q)(X_c)$ (6) Calculate $\alpha_{nom} = 1/2RC$ for the nominal values.

$$\alpha_{nom} = \frac{1}{2RC} = \frac{1}{2(2.27K)(100pf)} = 2.2026 \times 10^6$$

(7) The result of step (6) is the Neper frequency or "exponential decay" used to scale as a constant across the band of the filter. Since the filter is symmetrical about $f_0$, we need only to calculate $\alpha$ at the resonance above, ($f_4$) and below, ($f_2$) $f_0$ for arm 18. Arm 16 will then use the same capacitor values but in reverse order.

$$\alpha(f_2) = 2.2026 \times 10^6 \left(\frac{66.25 \text{ MHz}}{70 \text{ MHz}}\right) = 2.0846 \times 10^6$$

$$\alpha(f_4) = 2.2026 \times 10^6 \left(\frac{71.25 \text{ MHz}}{70 \text{ MHz}}\right) = 2.2419 \times 10^6$$

(8) Arm 18 contains individual parallel resonances at $f_2$ and $f_4$ representing finite attenuation poles. It is necessary, however, that at frequency $f_3$, arm 18 contain a transmission zero as discussed earlier. In order for arm 18 to be series resonant at $f_3$, it is necessary to employ the capacitance residual from $f_2$ (above resonance) and obtain the proper magnitude of inductance from $f_4$ (below resonance). These solutions must be simultaneously achieved while maintaining the correct $\alpha$ and parallel resonances.

$$\alpha(f_3) = 2.2026 \times 10^6 \left(\frac{68.75}{70}\right) = 2.163 \times 10^6$$

Note that $\alpha(f_3)$ must be obtained from a series resonant circuit where $\alpha = R'/2L$ where $$R' = \frac{R_p}{1 + Q^2} = 0.227\Omega, \text{ then:}$$

$$\frac{R'}{2L} = 2.163 \times 10^6; \frac{1}{L} = \frac{(2)(2.163 \times 10^6)}{(0.227)},$$

$$L = 52.47 \text{ nH.}$$

This is actually a mythical inductance which is used only to calculate the final capacitor values necessary at $f_2$ and $f_4$ to provide the proper $\alpha$.

The capacitor values are calculated using the standard approximation for resonance $$\omega_0 = \frac{1}{\sqrt{LC}} \quad (R >> \omega L).$$

Therefore, applying this to $f_2$ we obtain:

$$66.25 \text{ MHz} = \frac{1}{(2\pi)\sqrt{52.47 \times 10^{-9} C_2}}$$

so that:

$$C_2 = 109.99 \text{ pf}; (f_2 = 68.75 \text{ MHz})$$

Likewise, $C_4$ is found to be 95.1 pf. ($f_4 = 71.25$ MHz).

(9) The simple calculations above must now succumb to some logical reasoning. $C_2$ and $C_4$ were calculated based upon the $\alpha$ desired to be simultaneously exhibited by the other arm—the one containing $f_3$ and $f_5$. Since the value for $\alpha$ should be scaled across the entire filter, and not just in one arm, the capacitors calculated to be used as $C_2$ and $C_4$ must be actually used for $C_3$ and $C_5$ respectively. This requires that the values for $C_2$ and $C_4$ be reversed to provide the exponential value symmetry for each lattice arm and for the filter simultaneously. With this realization, the capacitor values calculated may be placed in the filter as follows:

| Arm 18: | $f_2$, 66.25 MHz, $C_2$ value = 95.1 pf |
| --- | --- |
| | $f_4$, 71.25 MHz, $C_4$ value = 110 pf |
| Arm 16: | $f_3$, 68.75 MHz, $C_3$ value = 110 pf |
| | $f_5$, 73.75 MHz, $C_5$ value = 95.1 pf |

The corrector resonators, $f_1$ and $f_6$, are yet to be determined.

(10) With the capacitor values thus selected, it is a simple matter to parallel each value with an inductor to provide the proper center frequency using the resonance approximation, $$\omega_0 = \frac{1}{\sqrt{LC}}.$$

The resulting values for the example are:

| Arm 16: | $C_3$ = 110 pf, $L_3$ = 48.719 nH, $Q_u$ = 100, f = 68.75 MHz |
| --- | --- |
| | $C_5$ = 95.1 pf, $L_5$ = 49.022 nH, $Q_u$ = 100, f = 73.75 MHz |
| Arm 18: | $C_2$ = 95.1 pf, $L_2$ = 60.749 nH, $Q_u$ = 100, f = 66.25 MHz |
| | $C_4$ = 110 pf, $L_4$ = 45.360 nH, $Q_u$ = 100, f = 71.25 MHz |

(11) The values of the corrector capacitors must be selected to achieve two simultaneous results:

(1) the magnitude of the corrector resonator must have the desired effect of cancelling the closest in-band pole in the opposite lattice arm, and (2) the effect must exponentially vanish out of band with a damping coefficient such that it provides no over-shoot and maintains the proper $\alpha$ to insure a (resistance) transition to a low value. The termination of the filter for the transition out of band is extremely important. However, at frequencies as far as 2 $\Delta f$ out of band, the termination of the filter is relatively unimportant allowing the use of zeros 34 as mentioned earlier.

Continuing with the idea of exponential sizing for the filter capacitor values (since we have used a linear frequency spacing), we may estimate the corrector capacitor values as follows:

$$C_c \text{ (nominal)} = \frac{1}{1 - e^{-1}} (95.1 \text{ pf}) = 150.3 \text{ pf.}$$

The value 95.1 pf will be recognized as the smallest value in each arm. Since the "nominal" capacitor value which was originally calculated in step (4) was 100 pf and not 95 pf, a closer estimate for the two corrector capacitors may be found by allowing for the average difference between these values. Thus:

$$C_c = 150.3 \text{ pF} \pm 2.5 \text{ pF.}$$

The larger value ≃152 pF would be associated with $f_1$, while the smaller value of 148 pF would be used with $f_6$.

(12) The inductances to be used are calculated as in step (10), and the final corrector values are found to be:

Arm 16: $f_1 = 65$ MHz, $C_1 = 152$ pF, $L_1 = 39.44$ nh, $Q_u = \phi$

Arm 18: $f_6 = 75$ MHz, $C_6 = 148$ pF, $L_6 = 30.426$ nh, $Q_u = 100$

At this point it should be noted that since the corrector capacitors are not twice the value of the in-band capacitors, the transmission zero formed by the corrector and its closest in-band neighbor in each arm will not fall precisely on top of the pole to be cancelled in the opposite arm. This dilemma is solved by purposely tuning the correctors out of band by 20% of the 2 $\Delta f$ value. In the case of the present example, this amounts to 500 kHz. The values of $L_1$ and $L_6$ are adjusted to do this, resulting in the new values for $L_1$ and $L_6$ of 40.057 and 30.025 nh, respectively.

(13) The final step is to calculate a compensation circuit which will be placed in series with the entire filter. The use of this circuit is discussed in Lerner's article, and consists of a series LC circuit resonant at $f_0$. This circuit is useful to absorb the reactive components of both the filter and the source/load. Since the nework is in series with the filter, rather than in parallel as it would be in the Y style Lerner filter, it is necessary that its bandwidth be greater than that of the filter. For the Z-transformed filter using the capacitor values of 2X for the corrector poles, the Lerner theory reveals that the Q required of this network be 3/5 that of the filter.

The use of the exponential methods described in this example results in non-existent or very minimal group delay ears; therefore, the effect of this compensation network on the filter is much less. However, it has been found experimentally that such a network is useful indeed for "tuning" the source and load reactances. During such experiments, it has been determined that the correct value range for these components is non-critical and reasonably close to an inductive reactance that is 5/3 of the total loop resistance of the filter. For the example, when the losses due to the finite Q's of the networks is included, $X_L$ is found to be 874 ohms corresponding to an inductor of about 2 $\mu$H. The capacitance required for 70 MHz resonance is then found to be 2.5 pF.

Figure 2:
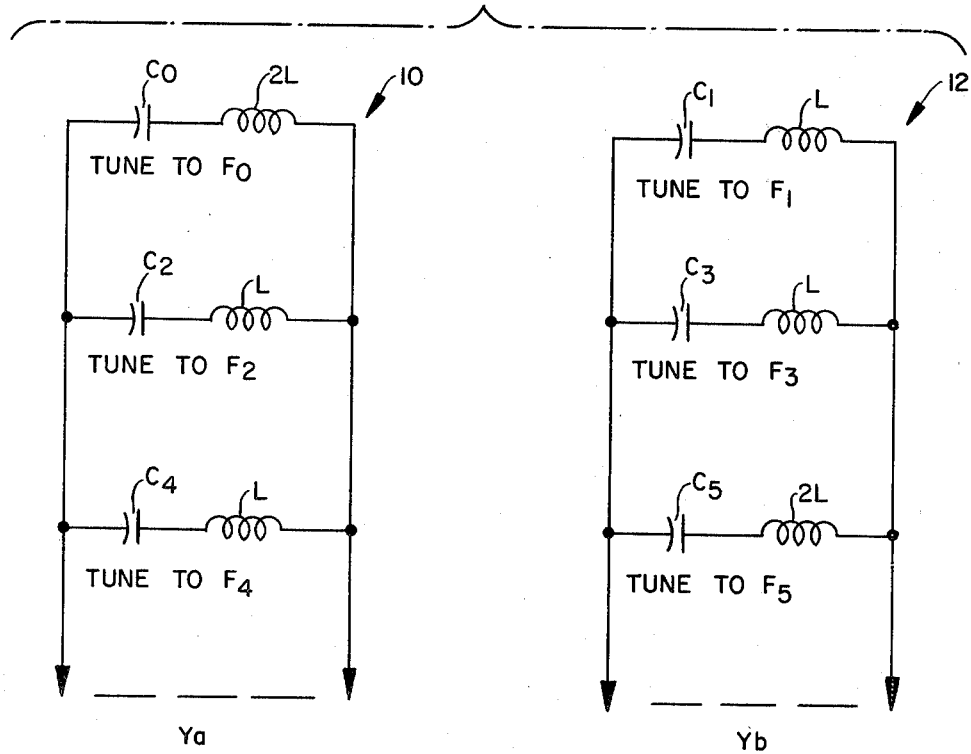
Figure 3:
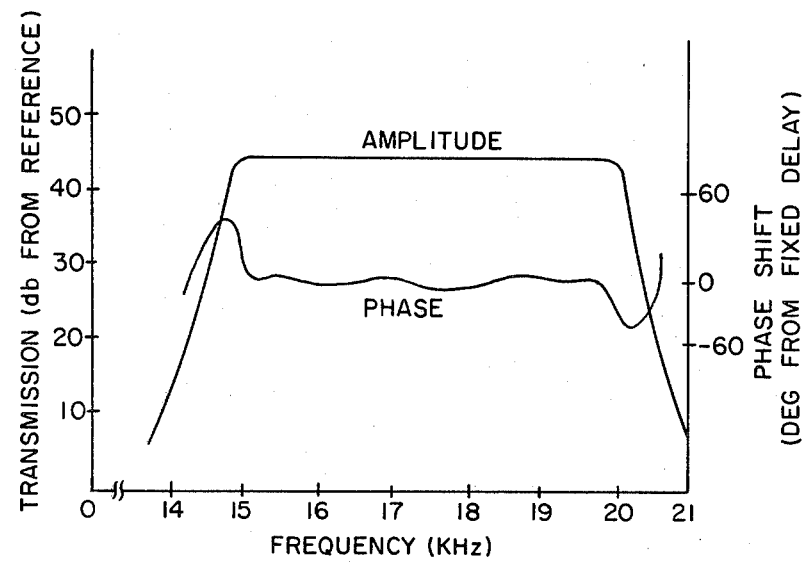
FIG. 3 is a graph showing the amplitude and phase characteristics of the Lerner filter.

Using the above procedure, it is possible to design a bandpass filter having significantly reduced phase delay ears at the NBE. This is shown by comparing FIG. 6, which illustrates the characteristics of a filter designed in accordance with the present invention, with FIG. 2, which illustrates the characteristics of a prior art filter designed in accordance with the teachings of Lerner.

Further, it should be noted that these results are obtained with a very small overall number of resonators (for example, only four in-band and two corrector resonators are used in the example given above). Both of these are very important advantages over prior art systems such as Lerner.

One point which should be kept in mind is that these calculated values are approximations. Due to various factors which are extremely difficult to incorporate in calculations, such as stray capacitance in mutual coupling between inductors, it is almost always necessary to trim the filter by changing the values slightly once it is built to provide the overall best filter characteristics. Such trimming is readily accomplished by either measuring the values in a completed device and adjusting them accordingly, or by running a computer simulation with environmental conditions similar to those existing in actual manufactured filters. Such trimming operations are well known in the industry. However, using the above calculations alone, the inventor has found that the values calculated generally are within a fraction of one percent (1%) of the final trimmed values.

Although, as noted above, the use of a Y circuit at high frequency is not generally as desirable. The following values for the components for FIG. 7 arrived at by using the principles of the present invention discussed above for a 70 MHz filter are offered for comparison with the values derived above for the FIG. 4 embodiment:

| | | |
|---|---|---|
| $L_1$ | 38.1875 $\mu$Hy | |
| $C_1$ | 0.15944 PF | } $f = 64.5$ MHZ |
| $L_2$ | 23.775 $\mu$Hy | |
| $C_2$ | 0.24274 PF | } $f = 66.25$ MHz |
| $L_3$ | 27.4975 $\mu$Hy | |
| $C_3$ | 0.19489 PF | } $f = 68.75$ MHz |
| $L_4$ | 27.4975 $\mu$Hy | |
| $C_4$ | 0.18146 PF | } $f = 71.25$ MHz |
| $L_5$ | 23.775 $\mu$Hy | |
| $C_5$ | 0.19588 PF | } $f = 73.75$ MHz |
| $L_6$ | 36.9625 $\mu$Hy | |
| $C_6$ | 0.12022 PF | } $f = 75.5$ MHz |
| L compensator | 0.09636 $\mu$Hy | |
| C compensator | 53.6515 PF | $f = 70$ MHz |

As can be seen, in this case, the values of inductance in each arm are exponentially related in the same manner as the values of capacitance were in FIG. 4. However, because of the large values of inductance, it is difficult to prevent self-resonance of the coils due to the large values of stray capacitance which most coils of this size will produce between windings. One way to obtain values of inductance which are lower (thereby helping to avoid this self-resonance) is to devide the source and load resistances by a value M. In this case, the inductance values will become L/M, the capacitance values will be (M) (C) and the filter resistance will be R/M.

Although the invention has been described using a half-lattice arrangement with a transformer, it should be noted that a full-lattice arrangement could be used, if desired, by using two pairs each of the lattice arms described previously herein coupled in a conventional full-lattice manner.

Also, although the invention has been primarily described for use as a bandpass filter, it could also be used for a low pass filter. In such a case, if using a half-lattice, it would be necessary to use an active power combiner rather than a transformer since a transformer would not pass the desired DC current.

Further, although the invention has been discussed in terms of an even number of resonators, it should be understood that a filter could be designed in accordance with the present invention utilizing an odd number of resonators. In this regard, it should be noted that Lerner generally utilized an odd number of resonators in his Y configuration. However, whether using a Y circuit or a Z circuit, if an odd number of resonators are used, it must be kept in mind that more care in adjustment will be necessary at high frequencies since an odd number of resonators means one arm will have more elements than the other. This will create an imbalance which will become noticeable at high frequencies if careful adjustments are not made to offset it.

It should also be noted that although the preferred embodiment of the present invention has been described in terms of exponential sizing of the components with linear frequency spacing of the resonators in the bandwidth of the filter, the invention could also be used by providing substantially identical sizing of the components (as Lerner does) but by then spacing the frequencies of resonance so that the exponential damping coefficients for the resonators in each arm decay at the same rate.

It is to be understood that the above-described arrangements are simply illustrative of the application of the principles of this invention. Numerous other arrangements may be readily devised by those skilled in the art which embody the principles of the invention and fall within its spirit and scope.

I claim:

1. A filter for filtering an electrical signal to pass said electrical signal within a predetermined bandwidth of frequencies centered around a predetermined center frequency comprising:
   an input coupled to receive said electrical signal;
   an output for providing a filtered output signal; and
   a pair of lattice arms coupled in parallel between said input and output, wherein each arm includes a plurality of parallel resonant LC resonators connected in series along each arm, each of said resonators having a different resonant frequency within the bandwidth of said filter,
   wherein the capacitors of the resonators in each arm have values which are substantially exponentially related in accordance with the frequency of resonance of the resonator they are in to the capacitance determined for resonance at the center frequency.

2. A filter according to claim 1, wherein the values of inductance and capacitance in each of the resonators are set so that when parallel resonance occurs in one of the parallel resonators in one of said arms, series resonance will occur between a pair of said parallel resonators in the other arm.

3. A filter according to claim 1, wherein the frequency of resonance for the respective resonators is spaced linearly, relative to one another, across the bandwidth of the filter with a spacing of 2 $\Delta f$=bandwidth of the filter/number of resonators within the bandwidth.

4. A filter according to claim 3, wherein each arm includes a corrector resonator tuned for parallel resonance outside of the bandwidth of the filter, and wherein the values of inductance and capacitance for said corrector resonators are set to provide series resonance with another resonator in the same arm as the corrector resonator at a frequency adjacent to a nominal band edge of the filter at which one of the resonators in the other arm attains parallel resonance.

5. A filter according to claim 4, wherein the value of capacitance in the corrector resonator is set to be substantially exponentially related to the capacitance which is determined for resonance at the center frequency.

6. A filter according to claim 4 or 5, wherein the corrector resonators are tuned for resonance at a frequency outside of the nominal band edge of the filter by a frequency equal to 20% of 2 $\Delta f$.

7. A filter according to claim 1 or 5, wherein the value of the capacitors in the resonators in one arm increase exponentially from the lowest value of resonant frequency to the highest value of resonant frequency while the values of capacitance in the resonators in the other arm decrease exponentially from the lowest value of resonant frequency to the highest value of resonant frequency, and wherein the respective exponential increase and decrease in the arms are centered around the same value of capacitance determined for resonance at the center frequency.

8. A bandpass filter for filtering an electrical signal to pass said electrical signal within a predetermined bandwidth of frequencies centered around a predetermined center frequency with a substantially constant group delay and with a phase characteristic which converges toward the amplitude characteristic near a nominal band edge of the filter comprising:
   an input coupled to receive said electrical signal;
   an output for providing a filtered output signal;
   a pair of lattice arms coupled in parallel between the input and output of each lattice arm including a plurality of parallel LC resonators connected in series along each arm, each of said resonators having a different resonant frequency within said bandwidth of said filter, wherein the values for inductance and capacitance in each resonator are set so that when parallel resonance occurs in one of said arms, series resonance will occur between a pair of said parallel resonators connected in series in the other arm, and wherein the frequencies of parallel resonance are spaced linearly, relative to one another, across the bandwidth of the filter with the spacing of 2 $\Delta f$=bandwidth of the filter/number of resonators within the bandwidth;
   a transformer coupled between the arms and the output of the filter, said transformer being coupled to cancel the electrical signal passing through each arm to the transformer if the value of the electrical signal is the same in each arm so that the output will be zero when the electrical signal is the same in each arm,
   wherein the capacitance of the resonators in each arm have values which are substantially exponentially related in accordance with the frequency of resonance of the resonator they are in to the capacitance which is determined for resonance at the center frequency, and further wherein each arm includes a corrector resonator tuned for parallel resonance outside of the bandwidth, said corrector resonators each having values of conductance and capacitance set to provide series resonance with another resonator in the same arm as the corrector resonator at a frequency adjacent to the nominal band edge of the filter at which one of the resonators in the other arm attains parallel resonance.

9. A filter for filtering an electrical signal to pass said electrical signal within a predetermined bandwidth of frequencies centered around a predetermined center frequency comprising:

an input coupled to receive said electrical signal;
an output for providing a filtered output signal; and
a pair of lattice arms coupled in parallel between said input and output, wherein each arm includes a plurality of LC resonators along each arm, each of said resonators having a different resonant frequency within the bandwidth of said filter,
wherein the exponential damping coefficients for the resonators in each arm are set to decay at the same rate within the bandwidth of the filter.

10. A filter according to claim 9, wherein the resonators in each arm are parallel LC resonators connected in series with one another along each arm.

11. A filter according to claim 10, wherein the values of inductance and capacitance in each of the resonators are set so that when parallel resonance occurs in one of the parallel resonators in one of said arms, series resonance will occur between a pair of said parallel resonators in the other arm.

12. A filter according to claim 11, wherein the frequency of resonance for the repective resonators is spaced linearly, relative to one another, across the bandwidth of the filter with a spacing of 2 $\Delta f$ = bandwidth of the filter/number of resonators within the bandwidth.

13. A filter according to claim 10, wherein the capacitors of the resonators in each arm have values which are substantially exponentially related in accordance with the frequency of resonance of the resonator they are in to the capacitance determined for resonance at the center frequency.

14. A filter according to claim 12, wherein each arm includes a corrector resonator tuned for parallel resonance outside of the bandwidth of the filter, and wherein the values of inductance and capacitance for said corrector resonators are set to provide series resonance with another resonator in the same arm as the corrector resonator at a frequency adjacent to a nominal band edge of the filter at which one of the resonators in the other arm attains parallel resonance.

15. A filter according to claim 14, wherein the value of capacitance in the corrector resonator is set to be substantially exponentially related to the capacitance which is determined for resonance at the center frequency.

16. A filter according to claim 14 or 15, wherein the corrector resonators are tuned for resonance at a frequency outside of the nominal band edge of the filter by a frequency equal to 20% of 2 $\Delta f$.

17. A filter according to claim 13 or 14, wherein the value of the capacitors in the resonators in one arm increase exponentially from the lowest value of resonant frequency to the highest value of resonant frequency while the values of capacitance in the resonators in the other arm decrease exponentially from the lowest value of resonant frequency to the highest value of resonant frequency, and wherein the respective exponential increase and decrease in the arms are centered around the same value of capacitance determined for resonance at the center frequency.

18. A filter according to claim 9, wherein the exponential damping coefficient $a_N$ for each resonator is set to equal $$a_N = F_N/F_O a_O$$

where:
$F_O$ is the predetermined center frequency,
$F_N$ is the resonant frequency of the resonator, and
$a_O$ is the exponential damping coefficient determined for the center frequency.

19. A bandpass filter for filtering an electrical signal to pass said electrical signal within a predetermined bandwidth of frequencies centered around a predetermined center frequency with a substantially constant group delay and with a phase characteristic which converges toward the amplitude characteristic near a nominal band edge of the filter comprising:

an input coupled to receive said electrical signal;
an output for providing a filtered output signal;
a pair of lattice arms coupled in parallel between the input and output of each lattice arm including a plurality of parallel LC resonators connected in series along each arm, each of said resonators having a different resonant frequency within said bandwidth of said filter, wherein the values for inductance and capacitance in each resonator are set so that when parallel resonance occurs in one of said arms, series resonance will occur between a pair of said parallel resonators connected in series in the other arm, and wherein the frequencies of parallel resonance are spaced linearly, relative to one another, across the bandwidth of the filter with the spacing of 2 $\Delta f$ = bandwidth of the filter/number of resonators within the bandwidth;
a transformer coupled between the arms and the output of the filter, said transformer being coupled to cancel the electrical signal passing through each arm to the transformer if the value of the electrical signal is the same in each arm so that the output will be zero when the electrical signal is the same in each arm,
wherein the exponential damping coefficients for the resonators in each arm are set to decay at the same rate within the bandwidth of the filter, and further wherein each arm includes a corrector resonator tuned for parallel resonance outside of the bandwidth, said corrector resonators each having values of conductance and capacitance set to provide series resonance with another resonator in the same arm as the corrector resonator at a frequency adjacent to the nominal band edge of the filter at which one of the resonators in the other arm attains parallel resonance.

20. A filter according to claim 19, wherein the exponential damping coefficient $a_N$ for each resonator within the bandwidth of the filter is set to equal $$a_N = F_N/F_O a_O$$

where:
$F_O$ is the predetermined center frequency,
$F_N$ is the resonant frequency of the resonator, and
$a_O$ is the exponential damping coefficient determined for the center frequency.

21. A filter for filtering an electrical signal to pass said electrical signal within a predetermined bandwidth of frequencies centered around a predetermined center frequency comprising:
an input coupled to receive said electrical signal;
an output for providing a filtered output signal; and
a pair of lattice arms coupled in parallel between said input and output, wherein each arm includes a plurality of series resonant LC resonators connected in parallel to one another in each arm, each of said resonators having a different resonant frequency within the bandwidth of said filter,
wherein the inductors of the resonators in each arm have values which are substantially exponentially related in accordance with the frequency of resonance of the resonator they are in to the inductance determined for resonance at the center frequency.

22. A filter according to claim 21, wherein the values of inductance and capacitance in each of the resonators are set so that when series resonance occurs in one of the series resonators in one of said arms, parallel resonance will occur between a pair of said series resonators in the other arm.

23. A filter according to claim 21, wherein the frequency of resonance for the respective resonators is spaced linearly, relative to one another, across the bandwidth of the filter with a spacing of 2 $\Delta f$ = bandwidth of the filter/number of resonators within the bandwidth.

24. A filter according to claim 21, wherein each arm includes a corrector resonator tuned for series resonance outside of the bandwidth of the filter, and wherein the values of inductance and capacitance for said corrector resonators are set to provide parallel resonance with another resonator in the same arm as the corrector resonator at a frequency adjacent to a nominal band edge of the filter at which one of the resonators in the other arm attains series resonance.

25. A filter according to claim 24, wherein the value of inductance in the corrector resonator is set to be substantially exponentially related to the inductance which is determined for resonance at the center frequency.

26. A filter for filtering an electrical signal to pass said electrical signal within a predetermined bandwidth of frequencies centered around a predetermined center frequency comprising:
an input coupled to receive said electrical signal;
an output for providing a filtered output signal; and
a pair of lattice arms coupled in parallel between said input and output, wherein each arm includes a plurality of series resonant LC resonators connected in parallel to one another in each arm, each of said resonators having a different resonant frequency within the bandwidth of said filter,
wherein the exponential damping coefficients for the resonators in each arm are set to decay at the same rate within the bandwidth of the filter.

27. A filter according to claim 26, wherein the exponential damping coefficient $a_N$ for each resonator is set to equal $$a_N = F_N/F_O a_O$$

where:
$F_O$ is the predetermined center frequency,
$F_N$ is the resonant frequency of the resonator, and
$a_O$ is the exponential damping coefficient determined for the center frequency.

28. A method for filtering an electrical signal to pass said electrical signal within a predetermined bandwidth of frequencies centered around a predetermined center frequency comprising:
applying said electrical signal to a pair of lattice arms coupled in parallel between an input and an output terminal, wherein each arm includes a plurality of parallel resonant LC resonators connected in series along each arm, each of said resonators having a different resonant frequency within the bandwidth of said filter,
wherein the capacitors of the resonators in each arm have values which are substantially exponentially related in accordance with the frequency of resonance of the resonator they are in to the capacitance determined for resonance at the center frequency.

29. A method for filtering an electrical signal to pass said electrical signal within a predetermined bandwidth of frequencies centered around a predetermined center frequency comprising:
applying said electrical signal to a pair of lattice arms coupled in parallel between an input and an output terminal, wherein each arm includes a plurality of parallel resonant LC resonators connected in series along each arm, each of said resonators having a different resonant frequency within the bandwidth of said filter,
wherein the exponential damping coefficients for the resonators in each arm are set to decay at the same rate.

30. A method for filtering an electrical signal to pass said electrical signal within a predetermined bandwidth of frequencies centered around a predetermined center frequency comprising:
applying said electrical signal to a pair of lattice arms coupled in parallel between an input and an output terminal, wherein each arm includes a plurality of series resonant LC resonators connected in parallel to one another in each arm, each of said resonators having a different resonant frequency within the bandwidth of said filter,
wherein the inductors of the resonators in each arm have values which are substantially exponentially related in accordance with the frequency of resonance of the resonator they are in to the inductance determined for resonance at the center frequency.

31. A method for filtering an electrical signal to pass said electrical signal within a predetermined bandwidth of frequencies centered around a predetermined center frequency comprising:
applying said electrical signal to a pair of lattice arms coupled in parallel between an input and an output terminal, wherein each arm includes a plurality of series resonant LC resonators connected in parallel to one another in each arm, each of said resonators having a different resonant frequency within the bandwidth of said filter,
wherein the exponential damping coefficients for the resonators in each arm are set to decay at the same rate within the bandwidth of the filter.

32. A method according to claim 29 or 31, wherein the exponential damping coefficient $a_N$ for each resonator within the bandwidth of the filter is set to equal $$a_N = F_N/F_O a_O$$

where:
$F_O$ is the predetermined center frequency,
$F_N$ is the resonant frequency of the resonator, and
$a_O$ is the exponential damping coefficient determined for the center frequency.

* * * * *